(12) United States Patent
Shindo et al.

(10) Patent No.: US 8,585,995 B2
(45) Date of Patent: Nov. 19, 2013

(54) HIGH PURITY ZRB₂ POWDER AND MANUFACTURING METHOD THEREOF

(75) Inventors: Yuichiro Shindo, Ibaraki (JP); Kouichi Takemoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 710 days.

(21) Appl. No.: 11/576,577

(22) PCT Filed: Sep. 5, 2005

(86) PCT No.: PCT/JP2005/016214
§ 371 (c)(1),
(2), (4) Date: Apr. 3, 2007

(87) PCT Pub. No.: WO2006/038406
PCT Pub. Date: Apr. 13, 2006

(65) Prior Publication Data
US 2008/0075648 A1    Mar. 27, 2008

(30) Foreign Application Priority Data
Oct. 7, 2004    (JP) ................................ 2004-294873

(51) Int. Cl.
| | | |
|---|---|---|
| C01B 35/04 | (2006.01) | |
| C01B 25/08 | (2006.01) | |
| B32B 5/16 | (2006.01) | |
| B32B 15/04 | (2006.01) | |
| B22F 3/00 | (2006.01) | |
| C04B 35/00 | (2006.01) | |
| B05D 1/12 | (2006.01) | |
| B05D 1/08 | (2006.01) | |

(52) U.S. Cl.
USPC ........... 423/297; 423/289; 428/402; 428/546; 428/627; 501/96.3; 501/96.1; 427/180; 427/446

(58) Field of Classification Search
None
See application file for complete search history.

(56) References Cited

U.S. PATENT DOCUMENTS

| | | | | | |
|---|---|---|---|---|---|
| 4,414,180 | A | * | 11/1983 | Fisher ........................... | 422/186 |
| 4,671,822 | A | * | 6/1987 | Hamashima et al. ............ | 75/244 |
| 4,678,759 | A | * | 7/1987 | Kida et al. ...................... | 501/92 |
| 4,952,532 | A | * | 8/1990 | Isozaki et al. .................. | 501/87 |
| 5,019,540 | A | * | 5/1991 | Kuramoto et al. ............. | 501/96.1 |
| 5,688,731 | A | * | 11/1997 | Chatterjee et al. ............. | 501/96.3 |
| 6,861,030 | B2 | | 3/2005 | Shindo | |
| 6,908,599 | B2 | * | 6/2005 | Mishra et al. .................. | 423/297 |
| 2004/0022712 | A1 | * | 2/2004 | Mishra et al. .................. | 423/297 |

OTHER PUBLICATIONS

McNallan et al.; Electrochemical Society proceedings; vol. 2001-12; 2001.*
Linton; The Optical Properties of Zirconium Diboride Thin Films; Thin Solid Films; vol. 20, Issue 1, pp. 17-21; 1974.*
http://www.us-nano.com/inc/sdetail/6704; Sep. 20, 2013.*
R.J. Irving et al., "The Oxidation of Titanium Diboride and Zirconium Diboride at High Temperatures", Journal of Less-Common Metals, vol. 16, pp. 103-112, May 22, 1968.
T. Ya. Kosolapova et al., "Impurities in ZrB2 Prepared by Different Methods", Journal of the Less-Common Metals, vol. 67, pp. 303-307, Jan. 1979.
Esp@Cenet Database, English Abstract of JP 7-277734, Oct. 24, 1995.
Esp@Cenet Database, English Abstract of JP 2004-203666, Jul. 22, 2004.
Esp@Cenet Database, English Abstract of JP 63-297273, Dec. 5, 1988.
Esp@Cenet Database, English Abstract of JP 63-282165, Nov. 18, 1988.

* cited by examiner

*Primary Examiner* — Guinever Gregorio
(74) *Attorney, Agent, or Firm* — Howson & Howson LLP

(57) ABSTRACT

A high purity $ZrB_2$ powder having a purity of 99.9 wt % or higher excluding C and gas components, and a manufacturing method of such high purity $ZrB_2$ powder, including the steps of: subjecting a Zr sponge raw material to electron beam melting and casting to prepare an ingot having a purity of 99.9 wt % or higher; cutting the ingot into a cut powder and hydrogenating the cut powder into $ZrH_2$; pulverizing and dehydrogenating the resultant product into a Zr powder and oxidizing the Zr powder at a high temperature in an oxygen atmosphere into a $ZrO_2$ fine powder; and mixing the $ZrO_2$ fine powder with B having a purity of 99.9 wt % or higher so as to reduce $ZrO_2$ and obtain a $ZrB_2$ powder having a purity of 99.9 wt % or higher. Purity of the $ZrB_2$ powder for use in sintering is made to be 99.9 wt % or higher, which is required in the manufacture of a $ZrB_2$ single crystal substrate with the high frequency induction heating FZ method (Floating Zone Method), and it is thereby possible to obtain a high purity $ZrB_2$ powder and the manufacturing method thereof enabling the enlargement of a $ZrB_2$ single crystal substrate and reduction in the manufacturing costs associated therewith.

18 Claims, No Drawings

HIGH PURITY ZRB₂ POWDER AND MANUFACTURING METHOD THEREOF

BACKGROUND OF THE INVENTION

The present invention relates to a high purity $ZrB_2$ powder having a purity of 99.9 wt % or higher, and the manufacturing method thereof.

$ZrB_2$ (Zirconium Diboride) is a substance that has similar physical properties as GaN, and the lattice constant and coefficient of thermal expansion are both approximate. The electrical conductivity is high, and the specific thermal conductivity also shows a high value comparable to metallic molybdenum. In recent years, the use of $ZrB_2$ as a substrate for blue laser semiconductors utilizing the foregoing properties is being studied.

The crystal structure of $ZrB_2$ is an alternately overlapping structure of a hexagonal net-like boron layer and zirconium metal layer. It is necessary to grow single crystals in the foregoing usage as a substrate, and the high frequency induction heating FZ method (Floating Zone Method) is generally used for manufacturing this single crystal substrate (refer to Non-Patent Document 1).

Nevertheless, in the manufacture of a single crystal substrate with the FZ method, a major problem has been discovered. The problem is that the purity of the $ZrB_2$ powder raw material to be used in sintering is inferior and it is difficult to manufacture large single crystals, whereby the manufacturing efficiency is extremely inferior.

As conventional technology, for instance, as shown in Patent Document 1, proposed is a manufacturing method of a high purity $ZrB_2$ sintered body of adding to the $ZrB_2$ powder an organosilicon compound capable of primarily transforming into SiC based on pyrolysis, molding the resultant product, and thereafter performing pressureless sintering thereto.

Nevertheless, Patent Document 1 relates to cutting tools and thermal engine components utilizing properties such as high hardness, high heat resistance, high corrosion resistance and the like, and the purity of $ZrB_2$ was essentially left out of consideration.

Further, a manufacturing method of a mixed powder containing zirconium oxide and boride, and a compound sintered body containing such powder has been proposed (refer to Patent Document 2). Patent Document 2 is also for use in carbide tools and high-temperature structures, and similarly does not give consideration to demands of high purity materials.

In light of the foregoing circumstances, there is an article concerning the manufacture of a high purity $ZrB_2$ powder (refer to Non-Patent Document 2). Nevertheless, the manufacturing method of this high purity $ZrB_2$ powder is based on the reduction of $ZrO_2$ by $B_4C$ and C, and the inclusion of large amounts of C cannot be avoided.

Further, as shown in Table 1 of Non-Patent Document 2, the purity level is $ZrO_2$: 99.0%, $B_4C$: 97%, and large amounts of Si, Fe and the like are mixed in as impurities, and it cannot be said that sufficient purity was realized for obtaining the high purity $ZrB_2$ powder required in manufacturing a single crystal substrate.

[Non-Patent Document 1] The Institute of Electronics, Information and Communication Engineers, IEICE Technical Journal, Shigeki Otani "Present Situation of $ZrB_2$ Substrate Manufacture", pages 17 to 19, vol. 102, No. 114 (2002)

[Non-Patent Document 2] China Building Materials Academy, Beijing 100024, China, H. ZHAO and 2 others "PREPARATION OF ZIRCONIUM BORIDE POWDER" pages 573 to 576, (1995), $5^{th}$ Ins Symp Ceram. Mater. Compon. Engines 1994

[Patent Document 1] Japanese Patent Laid-Open Publication No. 63-297273

[Patent Document 2] Japanese Patent Laid-Open Publication No. S63-282165

SUMMARY OF THE INVENTION

An object of the present invention is to provide a high purity $ZrB_2$ powder and manufacturing method thereof, characterized in making the purity of a $ZrB_2$ powder for use in sintering to be 99.9 wt % or higher, which is required in the manufacturing of a $ZrB_2$ single crystal substrate with the high frequency induction heating FZ method (Floating Zone Method), and hereby being capable of enlarging the $ZrB_2$ single crystal substrate and reducing the manufacturing costs associated.

In light of the foregoing problems, the present invention provides:

1. A high purity $ZrB_2$ powder having a purity of 99.9 wt % or higher excluding C and gas components;
2. The high purity $ZrB_2$ powder according to paragraph 1 above, wherein the content of Hf and Ti as impurities is respectively 0.1 wt % or lower;
3. The high purity $ZrB_2$ powder according to paragraph 1 above, wherein the content of Fe, Cr and Nb as impurities is respectively 0.05 wt % or lower;
4. The high purity $ZrB_2$ powder according to any one of paragraphs 1 to 3 above, wherein the content of C as impurities is 0.1 wt % or lower; and
5. A manufacturing method of such high purity $ZrB_2$ powder, including the steps of: subjecting a Zr sponge raw material to electron beam melting and casting to prepare an ingot; cutting the ingot into a cut powder and hydrogenating the cut powder into $ZrH_2$; pulverizing and dehydrogenating the resultant product into a Zr powder and oxidizing the Zr powder at a high temperature in an oxygen atmosphere into a $ZrO_2$ fine powder; and mixing the $ZrO_2$ fine powder with B so as to reduce $ZrO_2$ and obtain a $ZrB_2$ powder.

As a result of the high purity $ZrB_2$ powder and its manufacturing method according to the present invention, it is possible to obtain a high purity $ZrB_2$ powder having a purity of 99.9 wt % or higher, and, by sintering this high purity $ZrB_2$ powder and using the sintered body (rod), it is possible to manufacture $ZrB_2$ single crystals from the melt based on the FZ method (Floating Zone Method). A significant effect is yielded in that single crystals can be manufactured easily since the purity is high, the manufacturing efficiency is improved, and large single crystals can be manufactured.

DETAILED DESCRIPTION OF THE INVENTION $ZrB_2$ has a high melting point of 3220° C., and, particularly among the impurities, C, ZrC, HfC, TiC and the like cannot be volatilized and removed. In other words, during the manufacture process of the $ZrB_2$ powder, once a substance gets mixed in as impurities, there is a problem in that such substance cannot be removed and will remain as impurities in the $ZrB_2$ powder.

As described above, $ZrB_2$ itself is primarily used for cutting tools and thermal engine components, and the current situation is that no consideration has been given to the improvement of purity.

Nevertheless, the present invention developed a method where C, ZrC, HfC, TiC and so on are not included during the manufacturing process of the $ZrB_2$ powder, and, as a result, it is possible to obtain a high purity $ZrB_2$ powder having a purity of 99.9 wt % or higher excluding impurities of C and gas components.

The present invention is able to make the content of Hf and Ti as impurities contained in the high purity $ZrB_2$ powder to be respectively 0.1 wt % or lower.

Further, the present invention is able to make the content of Fe, Cr and Nb as impurities to be respectively 0.05 wt % or lower, and make the content of C as impurities to be 0.1 wt % or lower. In particular, the reduction in the amount of C is effective in reducing carbides such as ZrC, HfC and TiC.

Moreover, by making the grain size of the $ZrB_2$ powder to be 100 μm or less, it is possible to obtain a dense and uniform sintered body optimal for use as a $ZrB_2$ sintered body to be utilized in the manufacture of $ZrB_2$ single crystals from the melt based on the FZ method (Floating Zone Method).

Upon manufacturing the high purity $ZrB_2$ powder of the present invention, foremost, high purity Zr sponge raw material is subject to electron beam melting and casting to prepare an ingot having a purity of 99.9 wt % or higher. Next, the ingot is cut into cut powder, and the cut powder is hydrogenated into $ZrH_2$. Since $ZrH_2$ is brittle, pulverizing $ZrH_2$ is extremely easy.

The pulverized $ZrH_2$ is dehydrogenated into Zr powder. It is thereby possible to obtain a Zr powder having a purity of 99.9 wt % or higher.

Further, the Zr powder is oxidized at a high temperature (heated to 500 to 900° C.) in an oxygen atmosphere into a $ZrO_2$ fine powder. Then, the $ZrO_2$ fine powder is mixed with a B (boron) powder and $ZrO_2$ is directly synthesized (reduced) with B to obtain a $ZrB_2$ powder having a purity of 99.9 wt % or higher.

As evident from the foregoing steps, reduction materials such as $B_4C$ or C described in the foregoing conventional technology are not used in the manufacturing process. It is therefore possible to significantly reduce impurities such as ZrC, HfC and TiC. Once these impurities get mixed in the $ZrB_2$, they cannot be volatilized and eliminated. Thus, to prevent the mixture of such impurities in the manufacture process of the $ZrB_2$ powder is extremely important in manufacturing $ZrB_2$ single crystals from the melt based on the FZ method (Floating Zone Method). The present invention achieved this with the foregoing manufacturing method.

EXAMPLES

Next, Examples and Comparative Examples of the present invention are explained. These Examples are merely illustrative, and the present invention shall in no way be limited thereby. In other words, the present invention shall only be limited by the scope of the present invention, and shall include the various modes and modifications other than the Examples of this invention.

Example 1

A Zr sponge raw material with a purity level of 3 N was subject to electron beam melting and casting to prepare an ingot having a purity of 99.99 wt % or higher.

Next, the ingot was cut into a cut powder, the cut powder was hydrogenated into $ZrH_2$, and this was pulverized into a $ZrH_2$ fine powder having an average grain size of several mm. The pulverized $ZrH_2$ was heated to a temperature of 800° C. and dehydrogenated into a Zr powder. A Zr powder having a purity of 99.99 wt % was obtained thereby.

The Zr powder was further heated to 800° C. and oxidized in an oxygen atmosphere into $ZrO_2$ fine powder. Next, the $ZrO_2$ fine powder was mixed with B (boron) having a purity of 99 wt %, and the $ZrO_2$ was directly synthesized (reduced) with B to obtain a $ZrB_2$ powder having a purity of 99.95 wt % or higher excluding C and gas components. Content of the respective impurities manufactured in Example 1 is shown in Table 1.

The $ZrB_2$ powder was subject to the high frequency induction heating FZ method (Floating Zone Method) in order to prepare an ingot. As a result, it was possible to obtain a large single crystal ingot with few impurities.

The obtained single crystals were subject to mirror polishing and etching processing, the size of the single crystals were measured, and the number of defects such as pits and gas pockets of 1 μm or larger in the crystals were measured. The results are shown in Table 1.

Example 2

A Zr sponge raw material with a purity level of 2 N and high Ti content was subject to electron beam melting and casting to prepare an ingot having a purity of 99.9 wt % or higher.

Next, the ingot was cut into a cut powder, the cut powder was hydrogenated into $ZrH_2$, and this was pulverized into a $ZrH_2$ fine powder having an average grain size of several mm. The pulverized $ZrH_2$ was heated to a temperature of 600° C. and dehydrogenated into a Zr powder. A Zr powder having a purity of 99.9 wt % was obtained thereby.

The Zr powder was further heated to 800° C. and oxidized in an oxygen atmosphere into $ZrO_2$ fine powder.

Next, the $ZrO_2$ fine powder was mixed with B (boron) having a purity of 99 wt % and a low C content, and the $ZrO_2$ was directly synthesized (reduced) with B to obtain a $ZrB_2$ powder having a purity of 99.9 wt % or higher excluding C and gas components. Content of the respective impurities manufactured in Example 2 is shown in Table 1.

The $ZrB_2$ powder was subject to the high frequency induction heating FZ method (Floating Zone Method) in order to prepare an ingot. As a result, it was possible to obtain a large single crystal ingot with few impurities.

The obtained single crystals were subject to mirror polishing and etching processing, the size of the single crystals were measured, and the number of defects such as pits and gas pockets of 1 μm or larger in the crystals were measured. The results are shown in Table 1.

Example 3

A Zr sponge raw material with a purity level of 2 N and a high Hf content was subject to electron beam melting and casting to prepare an ingot having a purity of 99.9 wt % or higher.

Next, the ingot was cut into a cut powder, the cut powder was hydrogenated into $ZrH_2$, and this was pulverized into a $ZrH_2$ fine powder having an average grain size of several mm. The pulverized $ZrH_2$ was heated to a temperature of 600° C.

and dehydrogenated into a Zr powder. A Zr powder having a purity of 99.9 wt % was obtained thereby.

The Zr powder was further heated to 800° C. and oxidized in an oxygen atmosphere into $ZrO_2$ fine powder. Next, the $ZrO_2$ fine powder was mixed with B (boron) having a purity of 99 wt %, and the $ZrO_2$ was directly synthesized (reduced) with B to obtain a $ZrB_2$ powder having a purity of 99.9 wt % or higher excluding C and gas components. Content of the respective impurities manufactured in Example 3 is shown in Table 1.

The $ZrB_2$ powder was subject to the high frequency induction heating FZ method (Floating Zone Method) in order to prepare an ingot. As a result, it was possible to obtain a large single crystal ingot with few impurities.

The obtained single crystals were subject to mirror polishing and etching processing, the size of the single crystals were measured, and the number of defects such as pits and gas pockets of 1 μm or larger in the crystals were measured. The results are shown in Table 1.

Example 4

A Zr sponge with a purity level of 3 N was highly purified with solvent extraction, and electron beam melting was performed thereto several times in order to prepare an ingot having a purity of 99.999 wt %. A $ZrO_2$ fine powder was prepared as with Example 1 and directly synthesized with B of 99.999 wt % to obtain $ZrB_2$ of 99.99 wt % excluding C and gas components. Content of the respective impurities manufactured in Example 4 is shown in Table 1. The obtained single crystals were subject to mirror polishing and etching processing, the size of the single crystals were measured, and the number of defects such as pits and gas pockets of 1 μm or larger in the crystals were measured. The results are shown in Table 1.

prepare an ingot, but the crystals were minute, and it was not possible to obtain a single crystal ingot. Further, the numerous defects and gas pockets were at an unmeasurable level.

Comparative Example 2

A Zr sponge with a purity level of 99 wt % and high content of Hf, Zr and C was hydrogenated and dehydrogenated into a Zr powder having a purity of 99 wt %. The Zr powder was mixed with a B powder with a purity level of 95% and directly synthesized into a $ZrB_2$ powder. Content of the respective impurities in the manufacture of Comparative Example 2 is shown in Table 2. Further, the numerous defects and gas pockets were at an unmeasurable level.

The $ZrB_2$ powder was subject to the high frequency induction heating FZ method (Floating Zone Method) in order to prepare an ingot, but the crystals were minute, and it was not possible to obtain a large single crystal ingot.

Comparative Example 3

A Zr sponge with a purity level of 99.9 wt % and slightly high content of C and Hf was hydrogenated and dehydrogenated into a Zr powder having a purity of 99.9 wt %. The Zr powder was mixed with a B powder with a purity level of 95% and directly synthesized into a $ZrB_2$ powder. Content of the respective impurities in the manufacture of Comparative Example 3 is shown in Table 2.

The $ZrB_2$ powder was subject to the high frequency induction heating FZ method (Floating Zone Method) in order to prepare an ingot, but the crystals were minute, and it was not possible to obtain a large single crystal ingot. Although the defect density and stomatal density could finally be measured here, the result showed numerous defects at $4 \times 10^7$ defects/$cm^2$, 53 gas pockets, respectively.

| | C | Hf | Ti | Fe | Cr | Nb | Average Crystal Grain Size | Defect Density (Defects/$cm^2$) | Stomatal Density (Gas Pockets/$cm^2$) |
|---|---|---|---|---|---|---|---|---|---|
| Example 1 | 500 | 40 | 50 | 20 | 40 | 2 | 20 mm | $6 \times 10^3$ | 2 |
| Example 2 | 80 | 80 | 350 | 150 | 60 | 20 | 25 mm | $3 \times 10^3$ | 1 |
| Example 3 | 950 | 450 | 40 | 120 | 160 | 30 | 10 mm | $1 \times 10^4$ | 3 |
| Example 4 | 20 | 5 | <1 | 2 | 1 | <1 | 50 mm | $1 \times 10^2$ | 0 |

Unit: wtppm

Average Crystal Grain Size: Size of single crystal

Comparative Example 1

Zr scrap with a purity level of 95 wt % and particularly high Hf content was hydrogenated into $ZrH_2$, and this was pulverized into a $ZrH_2$ fine powder having an average grain size of several mm. The pulverized $ZrH_2$ was heated to a temperature of 600° C. and dehydrogenated into a Zr powder. A Zr powder having a purity of 95 wt % was obtained thereby.

The Zr powder was further heated to 800° C. and oxidized in an oxygen atmosphere into $ZrO_2$ fine powder. Next, the $ZrO_2$ fine powder was mixed with B (boron) having a purity of 95 wt %, and the $ZrO_2$ was directly synthesized (reduced) with B to obtain a $ZrB_2$ powder having a purity of 95 wt % or higher. Content of the respective impurities in the manufacture of Comparative Example 1 is shown in Table 2.

The $ZrB_2$ powder was subject to the high frequency induction heating FZ method (Floating Zone Method) in order to Comparative Example 4

A Zr sponge with a purity level of 99.9 wt % and low content of Hf was hydrogenated, dehydrogenated and oxidized into a $ZrO_2$ powder having a purity of 99.9 wt %. The $ZrO_2$ powder was mixed with a B powder with a purity level of 99% and directly synthesized into a $ZrB_2$ powder. Content of the respective impurities manufactured in Comparative Example 4 is shown in Table 2.

The $ZrB_2$ powder was subject to the high frequency induction heating FZ method (Floating Zone Method) in order to prepare an ingot, but the crystals were minute, and it was not possible to obtain a large single crystal ingot. As with Comparative Example 3, although it was possible to measure the defect density and stomatal density, the result showed numerous defects at $6 \times 10^5$ defects/$cm^2$, 15 gas pockets, respectively.

Unit: wtppm

| | C | Hf | Ti | Fe | Cr | Nb | Average Crystal Grain Size | Defect Density (Defects/cm$^2$) | Stomatal Density (Gas Pockets/cm$^2$) |
|---|---|---|---|---|---|---|---|---|---|
| Comparative Example 1 | 950 | 22000 | 2680 | 2340 | 1290 | 660 | <1 mm | — | — |
| Comparative Example 2 | 4500 | 8520 | 7520 | 300 | 20 | 10 | 1 mm | — | — |
| Comparative Example 3 | 2900 | 5620 | 520 | 800 | 500 | 110 | 2 mm | $4 \times 10^7$ | 53 |
| Comparative Example 4 | 700 | 480 | 1300 | 650 | 150 | 5 | 5 mm | $6 \times 10^5$ | 15 |

Average Crystal Grain Size: Size of single crystal

The present invention is capable of making the purity of a ZrB$_2$ powder for use in sintering to be 99.9 wt % or higher, and it is thereby possible to significantly improve the purity of the sintered body required in the manufacturing of a ZrB$_2$ single crystal substrate with the high frequency induction heating FZ method (Floating Zone Method). Thus, the present invention is extremely useful in the manufacture of a ZrB$_2$ single crystal substrate since it is possible to enlarge a single crystal and reduce the manufacturing costs associated therewith.

The invention claimed is:

1. A high purity ZrB$_2$ powder having an average grain size of 100 μm or less and a purity of 99.9 wt % or higher excluding impurity C and other gas component elements, wherein a content of impurity C is 0.1 wt % or lower and contents of Fe, Cr and Nb as impurities are each 0.05 wt % or lower.

2. A high purity ZrB$_2$ powder according to claim 1, wherein contents of Hf and Ti as impurities are each 0.1 wt % or lower.

3. The high purity ZrB$_2$ powder according to claim 1, wherein said powder has a purity of 99.95 wt % or higher excluding gas component elements.

4. The high purity ZrB$_2$ powder according to claim 1, wherein said powder has a purity of 99.99 wt % excluding gas component elements.

5. The high purity ZrB$_2$ powder according to claim 1, wherein said powder is of a quality enabling an ingot of a single crystal of a size of 10 mm to 50 mm to be produced therefrom.

6. A manufacturing method of high purity ZrB$_2$ powder, including the steps of:
   subjecting a Zr sponge raw material to electron beam melting and casting to prepare an ingot;
   cutting the ingot into a cut powder and hydrogenating the cut powder into ZrH$_2$;
   pulverizing and dehydrogenating the resultant product into a Zr powder and oxidizing the Zr powder at a high temperature in an oxygen atmosphere into a ZrO$_2$ fine powder; and
   mixing the ZrO$_2$ fine powder with B so as to reduce ZrO$_2$ and obtain a ZrB$_2$ powder, wherein said ZrB$_2$ powder has an average grain size of 100 μm or less and a purity of 99.9 wt % or higher excluding impurity C and other gas component elements, wherein a content of impurity C is 0.1 wt % or lower and contents of Fe, Cr and Nb as impurities are each 0.05 wt % or lower.

7. A method according to claim 6, wherein a content of each of Hf and Ti as impurities in said ZrB$_2$ powder is 0.1 wt % or lower.

8. A high purity ZrB$_2$ powder, comprising:
   a high purity ZrB$_2$ powder having an average grain size of 100 μm or less and a purity of 99.9 wt % or higher excluding impurity C and gas component elements;
   said powder having a content of each of Fe, Cr and Nb as an impurity element of 0.05 wt % (500 wtppm) or lower;
   said powder having a content of each of Hf and Ti as an impurity element of 0.1 wt % (1000 wtppm) or lower;
   said powder having a content of impurity C of 0.1 wt % (1000 wtppm) or lower; and
   said powder being of a quality enabling an ingot of a single crystal of a size of 10 mm to 50 mm to be produced.

9. The high purity ZrB$_2$ powder according to claim 8, wherein said content of impurity C is within a range of 20 to 950 wtppm.

10. The high purity ZrB$_2$ powder according to claim 9, wherein said content of Hf is within a range of 5 to 450 wtppm.

11. The high purity ZrB$_2$ powder according to claim 10, wherein said content of Fe is within a range of 2 to 150 wtppm, and said content of Cr is within a range of 1 to 160 wtppm.

12. The high purity ZrB$_2$ powder according to claim 11, wherein said content of Nb is within a range of 2 to 30 wtppm.

13. The high purity ZrB$_2$ powder according to claim 11, wherein said content of Nb is less than 1 wtppm.

14. The high purity ZrB$_2$ powder according to claim 10, wherein said content of Ti is within a range of 40 to 350 wtppm.

15. The high purity ZrB$_2$ powder according to claim 10, wherein said content of Ti is less than 1 wtppm.

16. The high purity ZrB$_2$ powder according to claim 8, wherein said powder has a purity of 99.95 wt % or higher as determined when excluding gas component elements including impurity C.

17. The high purity ZrB$_2$ powder according to claim 8, wherein said powder has a purity of 99.99 wt %, as determined when excluding gas component elements including impurity C.

18. The high purity ZrB$_2$ powder according to claim 17, wherein said content of impurity C is 20 wtppm, a combined content of Hf and Ti is less than 6 wtppm, and a combined content of Fe, Cr and Nb is less than 4 wtppm.

* * * * *